(12) United States Patent
Sumanasekera et al.

(10) Patent No.: US 7,790,242 B1
(45) Date of Patent: Sep. 7, 2010

(54) METHOD FOR ELECTROSTATIC DEPOSITION OF GRAPHENE ON A SUBSTRATE

(75) Inventors: Gamini Sumanasekera, Louisville, KY (US); Anton N. Sidorov, Louisville, KY (US); P. John Ouseph, Louisville, KY (US); Mehdi M. Yazdanpanah, Louisville, KY (US); Robert W. Cohn, Louisville, KY (US); Romaneh Jalilian, Louisville, KY (US)

(73) Assignee: University of Louisville Research Foundation, Inc., Louisville, KY (US)

( * ) Notice: Subject to any disclaimer, the term of this patent is extended or adjusted under 35 U.S.C. 154(b) by 178 days.

(21) Appl. No.: 12/248,096

(22) Filed: Oct. 9, 2008

Related U.S. Application Data

(60) Provisional application No. 60/978,516, filed on Oct. 9, 2007.

(51) Int. Cl.
    B05D 1/04 (2006.01)
(52) U.S. Cl. .................................... 427/458; 427/457
(58) Field of Classification Search ............. 427/458, 427/457
    See application file for complete search history.

(56) References Cited

U.S. PATENT DOCUMENTS

| | | | |
|---|---|---|---|
| 6,087,765 A | 7/2000 | Coll et al. | |
| 6,812,634 B2 | 11/2004 | Murakami et al. | |
| 7,150,840 B2 | 12/2006 | Yanamoto et al. | |
| 7,381,316 B1 | 6/2008 | Lee et al. | |
| 7,405,854 B2 | 7/2008 | Desai et al. | |
| 7,417,320 B2 | 8/2008 | Kawabata et al. | |
| 2002/0009637 A1 | 1/2002 | Murakami et al. | |
| 2002/0157818 A1 | 10/2002 | Norley et al. | |
| 2002/0157819 A1 | 10/2002 | Norley et al. | |
| 2002/0166658 A1 | 11/2002 | Norley et al. | |
| 2002/0166660 A1 | 11/2002 | Norley et al. | |
| 2003/0044608 A1 | 3/2003 | Yoshizawa et al. | |
| 2003/0098640 A1 | 5/2003 | Kishi et al. | |
| 2004/0110005 A1 | 6/2004 | Choi et al. | |
| 2005/0116602 A1 | 6/2005 | Iijima et al. | |
| 2006/0014202 A1* | 1/2006 | Watanabe et al. ............... 435/6 |
| 2006/0062715 A1 | 3/2006 | Endo et al. | |

(Continued)

FOREIGN PATENT DOCUMENTS

EP        1122344         8/2001

(Continued)

OTHER PUBLICATIONS

Sidorov et al., "Electrostatic Deposition of Graphene," Nanotechnology, 18, 2007, 135301, 4 pps.

(Continued)

*Primary Examiner*—Frederick J Parker
(74) *Attorney, Agent, or Firm*—Stites & Harbison, PLLC; David W. Nagle, Jr.

(57) ABSTRACT

A method for electrostatic deposition of graphene on a substrate comprises the steps of securing a graphite sample to a first electrode; electrically connecting the first electrode to a positive terminal of a power source; electrically connecting a second electrode to a ground terminal of the power source; placing the substrate over the second electrode; and using the power source to apply a voltage, such that graphene is removed from the graphite sample and deposited on the substrate.

12 Claims, 3 Drawing Sheets

U.S. PATENT DOCUMENTS

| | | |
|---|---|---|
| 2006/0073275 A1 | 4/2006 | Maruyama et al. |
| 2006/0241237 A1* | 10/2006 | Drzal et al. ............... 524/495 |
| 2007/0030653 A1 | 2/2007 | Norley et al. |
| 2007/0184190 A1 | 8/2007 | Hiramatsu et al. |
| 2007/0207081 A1 | 9/2007 | Takikawa et al. |
| 2009/0127514 A1* | 5/2009 | Korkut et al. ............... 252/500 |

FOREIGN PATENT DOCUMENTS

| | | |
|---|---|---|
| EP | 1375460 | 1/2004 |
| JP | 2000-327317 | 11/2000 |
| JP | 2001-048509 | 2/2001 |
| JP | 2003-095627 | 4/2003 |
| JP | 2003-096555 | 4/2003 |
| JP | 2004-143652 | 5/2004 |
| JP | 2004-162203 | 6/2004 |
| JP | 2004-189501 | 7/2004 |
| JP | 2004-323345 | 11/2004 |
| JP | 2005-047763 | 2/2005 |
| JP | 2005-108721 | 4/2005 |
| JP | 2005-154200 | 6/2005 |
| JP | 2005-314162 | 11/2005 |
| JP | 2006-111515 | 4/2006 |
| JP | 2006-120730 | 5/2006 |
| JP | 2006-272491 | 10/2006 |
| WO | 02063693 | 8/2002 |
| WO | 2004005596 | 1/2004 |
| WO | 2004007363 | 1/2004 |
| WO | 2004089821 | 10/2004 |

OTHER PUBLICATIONS

Grimme et al., "Noncovalent Interactions between Graphene Sheets and in Multishell (Hyper) Fullerenes," J. Phys. Chem., 111 (30), 2007, pp. 11199-11207.

De Martino et al., "Magnetic Confinement of Massless Dirac Fermions in Graphene," Phys. Ref. Lett, 98, 2007, 066802, 4 pps.

Zhu et al., "New Insights into the Interaction of Hydrogen Atoms with Boron-Substituted Carbon," J. Phys. Chem., 110 (3), 2006, pp. 1249-1255.

Yan et al., "Synthesis and Structural Investigation of New Graphite Intercalation Compounds Containing the Perfluoroalkylsulfonate Anions $C10F21SO3C2F5OC2F4SO3-$, and $C2F5(C6F10)SO3-$," Carbon, 42, 2004, pp. 2981-2987.

Fang et al., "Carrier Statistics and Quantum Capacitance of Graphene Sheets and Ribbons," Appl. Phys. Lett., 91, 2007, 092109, 3 pps.

Pabba et al., "Oriented Nanomaterial Air Bridges Formed from Suspended Polymer-Composite Nanofibers," ACS Nano., 1(1), 2007, pp. 57-62.

Sidorov et al., "Electrostatic Deposition of Graphene," Abstract submitted for APS 2007 Conference, Denver, CO, Mar. 2007.

\* cited by examiner

METHOD FOR ELECTROSTATIC DEPOSITION OF GRAPHENE ON A SUBSTRATE

CROSS-REFERENCE TO RELATED APPLICATIONS

The present application claims priority to U.S. Provisional Patent Application Ser. No. 60/978,516 filed on Oct. 9, 2007, the entire disclosure of which is incorporated herein by reference.

STATEMENT REGARDING FEDERALLY SPONSORED RESEARCH

This invention was made with support from NASA Cooperative Agreement NCC5-571 and Grant No. W9113M-04-C-0024 awarded by the U.S. Army Space and Missile Defense Command. The government has certain rights in the invention.

BACKGROUND OF THE INVENTION

Graphene is a single planar sheet of $sp^2$ bonded carbon atoms. This two-dimensional structure provides the building block for the formation of three-dimensional graphite, one-dimensional nanotubes, and fullerenes (or "bucky balls.") Graphene is predicted to have remarkable physical properties, including large thermal conductivity as compared to the in-plane value of graphite, superior mechanical properties, and excellent electronic transport properties. Furthermore, the charge carriers in graphene are predicted to have zero effective mass, and the transport properties are expected to be governed by the relativistic Dirac equation rather than the Schrödinger equation.

Mechanical cleavage has been widely used to separate a few layers of graphene from highly oriented pyrolytic graphite (HOPG). Ribbons and terraces with step edges of graphene have been obtained by peeling off the surface layers of HOPG using scotch tape. Alternative methods, such as exfoliation and epitaxial growth on single-crystal silicon carbide substrates, have produced multilayer graphene sheets, but not single layer graphene sheets. In any event, known methods of producing graphene sheets are tedious and labor-intensive. Furthermore, none of the known methods address how to place the graphene sheets in a desired location, which is of great importance in constructing electrical experiments and assembling heterogeneous electronic systems.

SUMMARY OF THE INVENTION

The present invention is a method for electrostatic deposition of graphene on a substrate.

One side of a graphite sample, such as a highly oriented pyrolytic graphite (HOPG) sample, is first cleaved using the scotch tape technique (or other similar technique) to obtain a clean surface. Then, the other side of the graphite sample is secured to an electrode. This electrode is then electrically connected to the positive terminal of a high voltage power source. A second electrode is then electrically connected to the ground terminal of the power source. A substrate is then placed on the second electrode, and the power source is used to apply a voltage, such that graphene is removed from the graphite sample and deposited on the substrate.

Furthermore, in some implementations, an insulator is interposed between the second electrode and the substrate, which is intended to prevent a short circuit between the first and second electrodes.

Thus, the method of the present invention allows for the positioning of graphene on a suitable substrate at a selected location, which is important both for studying the fundamental properties of graphene and developing graphene-based devices. The method of the present invention also requires minimal resources and labor, yet allows for the deposition of a monolayer of graphene in a short period of time on any given substrate without the use of any chemical additives.

DETAILED DESCRIPTION OF THE INVENTION

The present invention is a method for electrostatic deposition of graphene on a substrate. Through the use of scanning tunneling microscopy (STM), it has been observed that there are numerous small sheets of graphene, of from one to several layers, on the surface of certain graphite samples, for example, freshly cleaved highly oriented pyrolytic graphite (HOPG). The sheets are loosely bound to the bulk graphite and can be removed from the surface by an electrostatic attractive force, for instance, by applying an electrostatic field from an STM tip.

Figure 1:
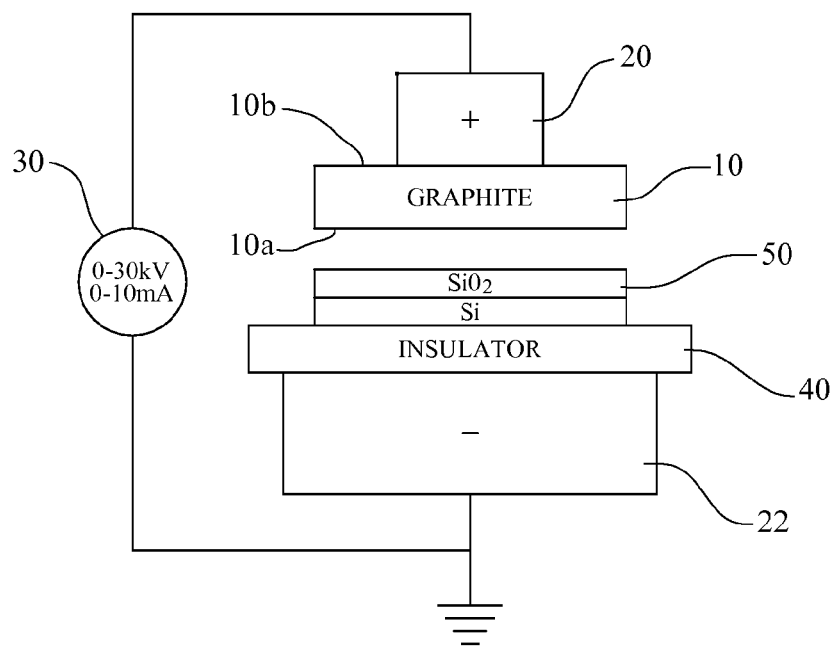
FIG. 1 is a schematic representation of an exemplary method for electrostatic deposition of graphene on a substrate in accordance with the present invention.

FIG. 1 is a schematic representation of an exemplary method for electrostatic deposition of graphene on a substrate in accordance with the present invention. In this exemplary implementation, one side 10a of a graphite sample 10, in this case, an HOPG sample, is first cleaved using the scotch tape technique (or other similar technique) to obtain a clean surface. Then, the other side 10b of the HOPG sample 10 is secured to an electrode 20. In this exemplary implementation, the HOPG sample 10 is secured to a copper electrode 20 using a silver epoxy (not shown). This electrode 20 is then electrically connected to the positive terminal of a high voltage power source 30 (0-30 kV and 0-10 mA).

Referring still to FIG. 1, a second electrode 22 is then electrically connected to the ground terminal of the power source 30. In this exemplary implementation, the second electrode 22 is in the form of a 3-mm thick copper plate. An insulator 40 is placed on the second electrode 22. In this exemplary implementation, the insulator 40, which is intended to prevent a short circuit between the first and second electrodes 20, 22, and therefore has a high breakdown voltage, is in the form of a 0.1-mm thick mica sheet. Of course, to the extent necessary, other insulators or materials with a high breakdown voltage could also be used to prevent a short circuit without departing from the spirit and scope of the present invention.

Referring still to FIG. 1, a substrate 50 is then placed over the insulator 40. Various materials could be used as a substrate, including both conducting and non-conducting materials. In this exemplary implementation, and as shown in FIG., 1, the substrate 50 is a 300-nm thick silicon dioxide (SiO$_2$) layer on a silicon layer (500 μm thick). By using the power source 30 to apply a voltage, graphene is pulled from the HOPG sample 10 by an electrostatic attractive force and deposited on the substrate 50.

Furthermore, with respect to the exemplary implementation illustrated in FIG. 1, it has been experimentally observed that by varying the applied voltage, the number of graphene layers deposited on the substrate 50 could be changed. For example, for an applied voltage V$_{ap}$ in the range of 3 kV<V$_{ap}$<5 kV, mostly single to three-layer thick graphene sheets are deposited on the substrate 50. For an applied voltage V$_{ap}$ in the range of 5 kV<V$_{ap}$<8 kV, sheets from three to seven layers thick are deposited on the substrate 50. For V$_{ap}$>10 kV, sheets of ten layers or more are deposited on the substrate. In short, the number of layers deposited was found to increase with the increasing applied voltage.

Figure 2:
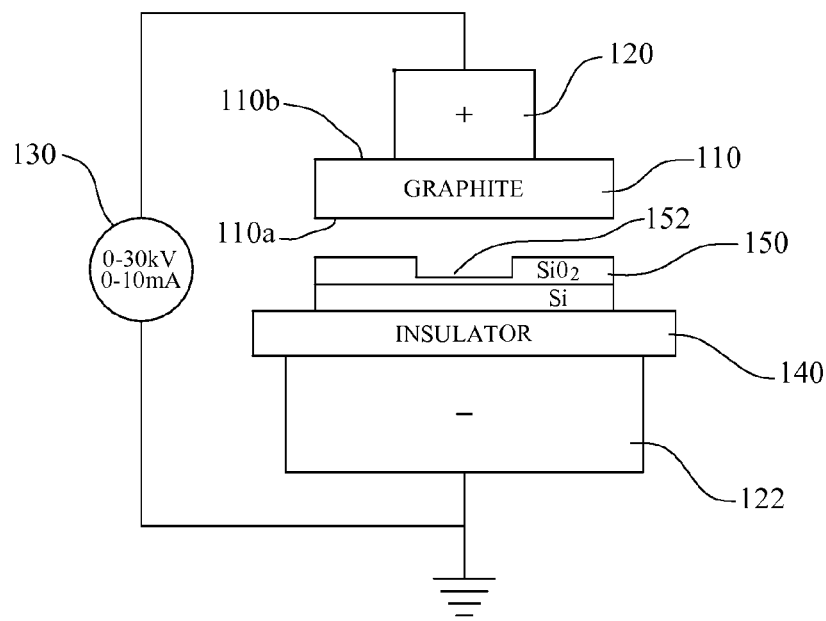
FIG. 2 is a schematic representation of another exemplary method for electrostatic deposition of graphene on a substrate in accordance with the present invention, in which a trench is formed in the substrate.
Figure 2A:
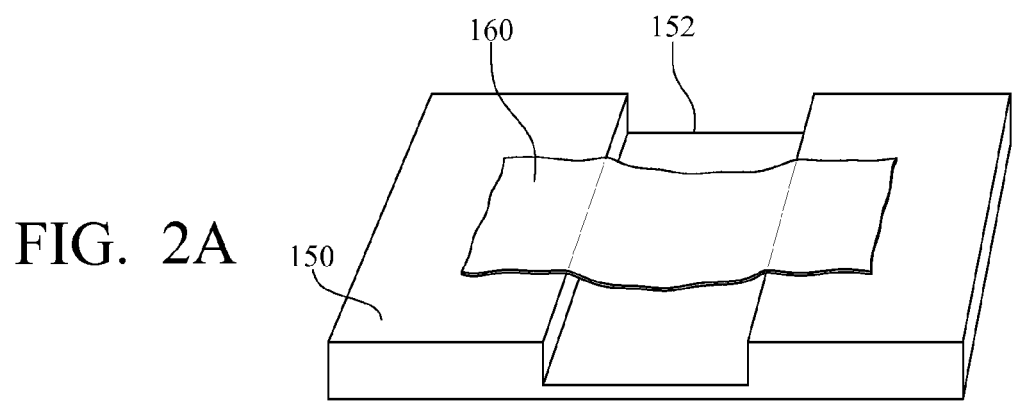
FIG. 2A is an illustration of the deposited graphene over the trench formed in the substrate.

FIG. 2 is a schematic representation of another exemplary method for electrostatic deposition of graphene on a substrate in accordance with the present invention. Similar to the implementation described above with reference to FIG. 1, one side 110a of an HOPG sample 110 is first cleaved using the scotch tape technique to obtain a clean surface, and then, the other side 110b of the HOPG sample 110 is secured to an electrode 120. This electrode 120 is then electrically connected to the positive terminal of a high voltage power source 130 (0-30 kV and 0-10 mA). A second electrode 122 (e.g., a 3-mm thick copper plate) is then electrically connected to the ground terminal of the power source 130. An insulator 140 (e.g., a 0.1-mm thick mica sheet) is placed on the second electrode 122. Finally, a substrate 150 is placed over the insulator 140. In this exemplary implementation, the substrate 150 again is a 300-nm thick silicon dioxide (SiO$_2$) layer on a silicon layer (500 μm thick). However, in the exemplary implementation, a trench 152 is formed in the substrate 150. Thus, when the power source 130 is used to apply a voltage, graphene is pulled from the HOPG sample 110 by an electrostatic attractive force and deposited on the substrate 150 and over the trench 152. FIG. 2A is an illustration of the deposited graphene 160 over the trench 152 formed in the substrate 150.

By suspending the deposited graphene 160 over a trench 152 in this manner, the suspended graphene 160 is effectively isolated from various substrate effects (except, of course, at the supported ends). For example, the suspended graphene 160 is effectively isolated from surface adhesion and strain forces, substrate temperature, substrate conductivity, and parasitic capacitance.

Figure 3:
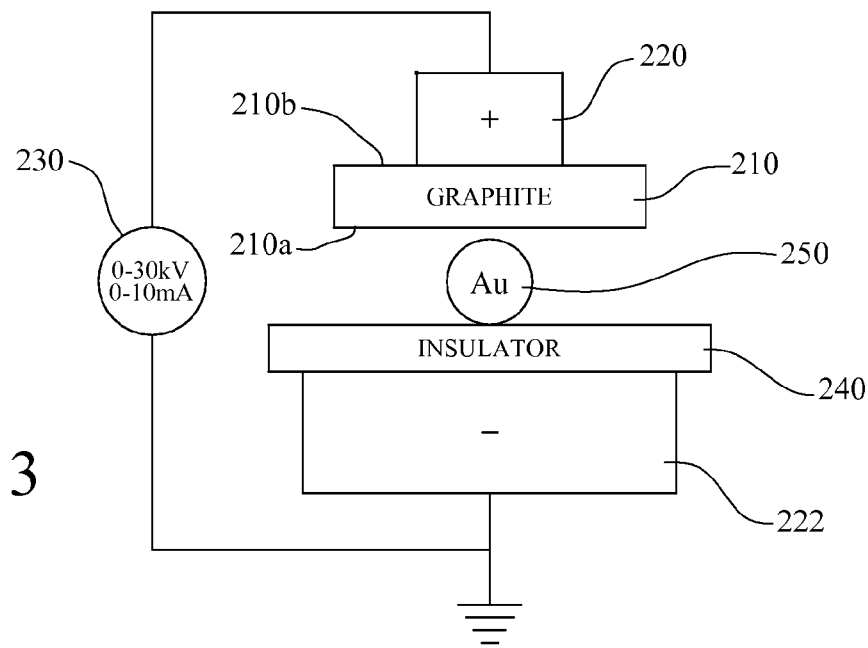
FIG. 3 is a schematic representation of an exemplary method for electrostatic deposition of graphene on a substrate in accordance with the present invention, in which the substrate is a conductive material in the form of a ball.

FIG. 3 is a schematic representation of another exemplary method for electrostatic deposition of graphene on a substrate in accordance with the present invention. Similar to the implementations described above with reference to FIGS. 1 and 2, one side 210a of an HOPG sample 210 is first cleaved using the scotch tape technique to obtain a clean surface, and then, the other side 210b of the HOPG sample 210 is secured to an electrode 220. This electrode 220 is then electrically connected to the positive terminal of a high voltage power source 230 (0-30 kV and 0-10 mA). A second electrode 222 (e.g., a 3-mm thick copper plate) is then electrically connected to the ground terminal of the power source 230. An insulator 240 (e.g., a 0.1-mm thick mica sheet) is placed on the second electrode 222. Finally, a substrate 250 is placed over the insulator 240. In this exemplary implementation, the substrate 250 is composed of a conductive material, specifically, gold (Au) in the form of a ball. Thus, when the power source 230 is used to apply a voltage, graphene is pulled from the HOPG sample 210 by an electrostatic attractive force and deposited on the substrate 250 (i.e., the gold ball).

Figure 4:
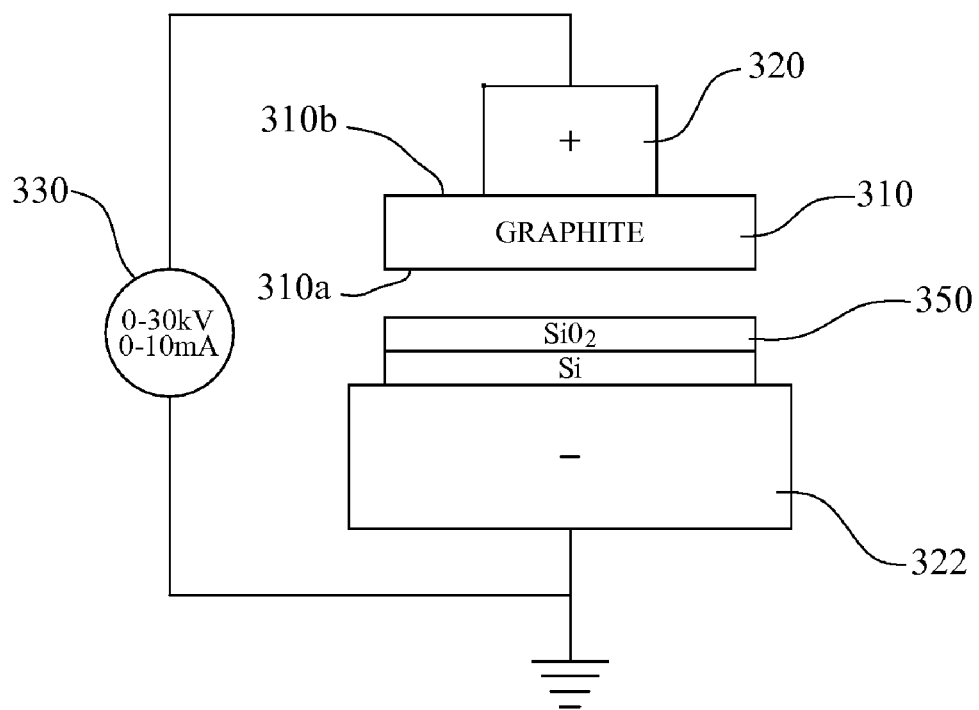
FIG. 4 is a schematic representation of another exemplary method for electrostatic deposition of graphene on a substrate in accordance with the present invention, in which no insulator is interposed between the second electrode and the substrate.

FIG. 4 is a schematic representation of another exemplary method for electrostatic deposition of graphene on a substrate in accordance with the present invention. Similar to the implementations described above with reference to FIGS. 1 and 2, one side 310a of an HOPG sample 310 is first cleaved using the scotch tape technique to obtain a clean surface, and then, the other side 310b of the HOPG sample 310 is secured to an electrode 320. This electrode 320 is then electrically connected to the positive terminal of a high voltage power source 330 (0-30 kV and 0-10 mA). A second electrode 322 (e.g., a 3-mm thick copper plate) is then electrically connected to the ground terminal of the power source 330. A substrate 350 is placed on the second electrode 322, with no insulator interposed between the second electrode 320 and the substrate 350. Such a configuration is possible provided that the current is controlled in another manner to prevent a short circuit between the first and second electrodes 320, 322. Again, when the power source 330 is used to apply a voltage, graphene is pulled from the HOPG sample 310 by an electrostatic attractive force and deposited on the substrate 350.

As a further refinement, in order to get a high-yield deposition of the graphene, it is contemplated that the surface of the substrate could be modified in some fashion. For example, a corrugated silicon micro-fabricated substrate may be used instead of a flat silicon substrate, such that the effective electric field is enhanced due to the sharp edges.

As yet a further refinement, it may be possible to control lateral size of the graphene by depositing it under controlled vacuum. It has been experimentally observed that by varying the vacuum pressure, the size of the deposited graphene can be increased or decreased.

The above-described method for electrostatic deposition of graphene on a substrate, which allows for the positioning of graphene on a suitable substrate at a selected location, is important both for studying the fundamental properties of graphene and developing graphene-based devices. For example, graphene can be deposited and positioned on very delicate structures, such as suspended microstructures and electronic devices. Furthermore, the ability to obtain graphene sheets of various thicknesses provides a unique way to pattern graphene for physical studies. Thus, the method of the present invention provides a convenient alternative to the common method of mechanical cleaving of HOPG (or another graphite sample), with the added benefit of selective deposition. The method of the present invention also requires minimal resources and labor, yet allows for the deposition of a monolayer of graphene in a short period of time on any given substrate. Furthermore, graphene can be directly deposited without any chemical additives, thus eliminating a major source of contamination that previously had been difficult to remove.

For further details about the method of the present invention, including its benefits and advantages, reference is made to the following article, which is incorporated herein by reference: Sidorov, Anton N.; Yazdanpanah, Mehdi M.; Jalilian, Romaneh; Ouseph, P. J.; Cohn, R. W.; and Sumanasekera, G. U., "Electrostatic deposition of graphene," Nanotechnology 18 (2007) 135301.

One of ordinary skill in the art will recognize that additional implementations are also possible without departing from the teachings of the present invention or the scope of the claims which follow. This detailed description, and particularly the specific details of the exemplary implementations disclosed, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. A method for electrostatic deposition of graphene on a substrate, comprising the steps of:
    securing a graphite sample to a first electrode;
    electrically connecting the first electrode to a positive terminal of a power source;
    electrically connecting a second electrode to a ground terminal of the power source;
    placing the substrate over the second electrode; and
    using the power source to apply a voltage, such that graphene is removed from the graphite sample and deposited on the substrate.

2. The method as recited in claim 1, and further comprising the step of interposing an insulator between the second electrode and the substrate.

3. The method as recited in claim 2, in which the insulator is a mica sheet.

4. The method as recited in claim 1, in which the graphite sample is highly oriented pyrolytic graphite (HOPG).

5. The method as recited in claim 4, and further comprising the step of cleaving the sample of highly oriented pyrolytic graphite (HOPG) to provide an appropriate surface for securing the first electrode to the sample.

6. The method as recited in claim 1, in which the graphite sample is secured to the first electrode using an epoxy.

7. The method as recited in claim 1, in which the substrate includes a trench, with graphene being deposited on the substrate and over the trench, such that a portion of the graphene is suspended over the substrate.

8. A method for electrostatic deposition of graphene on a substrate, comprising the steps of:
    securing a graphite sample to a first electrode;
    electrically connecting the first electrode to a positive terminal of a power source;
    electrically connecting a second electrode to a ground terminal of the power source;
    placing an insulator on the second electrode;
    placing the substrate over the insulator; and
    using the power source to apply a voltage, such that graphene is removed from the graphite sample and deposited on the substrate.

9. The method as recited in claim 8, in which the substrate is a conducting material.

10. The method as recited in claim 8, in which the graphite sample is highly oriented pyrolytic graphite (HOPG).

11. The method as recited in claim 10, and further comprising the step of cleaving the sample of highly oriented pyrolytic graphite (HOPG) to provide an appropriate surface for securing the first electrode to the sample.

12. The method as recited in claim 8, in which the substrate includes a trench, with graphene being deposited on the substrate and over the trench, such that a portion of the graphene is suspended over the substrate.

\* \* \* \* \*